(12) United States Patent
Fornof et al.

(10) Patent No.: US 6,933,586 B2
(45) Date of Patent: Aug. 23, 2005

(54) POROUS LOW-K DIELECTRIC INTERCONNECTS WITH IMPROVED ADHESION PRODUCED BY PARTIAL BURNOUT OF SURFACE POROGENS

(75) Inventors: Ann R Fornof, Blacksburg, VA (US); Jeffrey C Hedrick, Montvalle, NJ (US); Kang-Wook Lee, Yorktown Heights, NY (US); Christy S Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 10/290,616

(22) Filed: Nov. 8, 2002

(65) Prior Publication Data

US 2003/0111263 A1 Jun. 19, 2003

Related U.S. Application Data

(60) Provisional application No. 60/339,734, filed on Dec. 13, 2001.

(51) Int. Cl.$^7$ ............................................. H01L 29/00
(52) U.S. Cl. ...................... 257/508; 257/506; 257/507; 257/524
(58) Field of Search ................................ 257/506, 507, 257/508, 524, 773, 775

(56) References Cited

U.S. PATENT DOCUMENTS

| 6,071,809 | A | * | 6/2000 | Zhao | 438/634 |
| 6,177,199 | B1 | | 1/2001 | Hacker et al. | 428/447 |
| 6,218,020 | B1 | | 4/2001 | Hacker et al. | 428/447 |
| 6,271,127 | B1 | * | 8/2001 | Liu et al. | 438/638 |
| 6,284,149 | B1 | * | 9/2001 | Li et al. | 216/64 |
| 6,383,920 | B1 | | 5/2002 | Wang et al. | 438/639 |
| 6,451,712 | B1 | * | 9/2002 | Dalton et al. | 438/781 |
| 6,472,306 | B1 | * | 10/2002 | Lee et al. | 438/623 |
| 6,482,733 | B2 | * | 11/2002 | Raaijmakers et al. | 438/633 |
| 6,524,947 | B1 | * | 2/2003 | Subramanian et al. | 438/637 |

FOREIGN PATENT DOCUMENTS

| WO | WO 00/31183 | 6/2000 |
| WO | WO 00/40637 | 7/2000 |

* cited by examiner

*Primary Examiner*—Cathy Lam
(74) *Attorney, Agent, or Firm*—Ohlandt, Greeley, Ruggiero & Perle, L.L.P.; Daniel P. Morris

(57) ABSTRACT

An electrical interconnect structure on a substrate, includes a first porous dielectric layer with surface region from which a porogen has been removed; and an etch stop layer disposed upon the first porous dielectric layer so that the etch stop layer extends to partially fill pores in the surface region of the first porous dielectric layer from which the porogen has been removed, thus improving adhesion during subsequent processing. The porogen may be removed from the surface region by heating, and in particular by hot plate baking. A second porous dielectric layer, which may have the same composition as the first porous dielectric layer, may be formed over the etch stop layer. Electrical vias and lines may be formed in the first and second porous dielectric layer, respectively. The layers may be part of a multilayer stack, wherein all of the layers are cured simultaneously in a spin application tool porous dielectric layer.

25 Claims, 2 Drawing Sheets

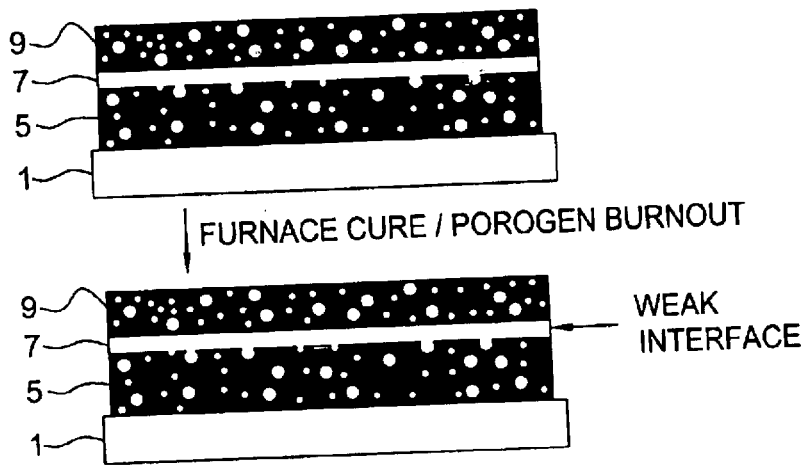
FIG. 1A Prior Art
FIG. 1B
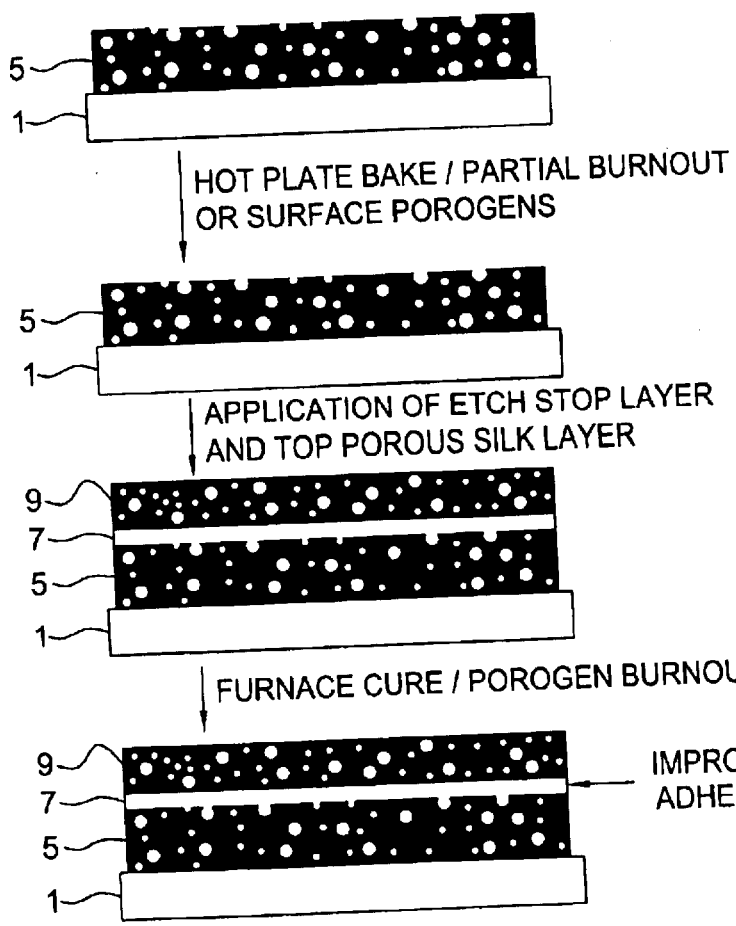
FIG. 2A
FIG. 2B
FIG. 2C
FIG. 2D

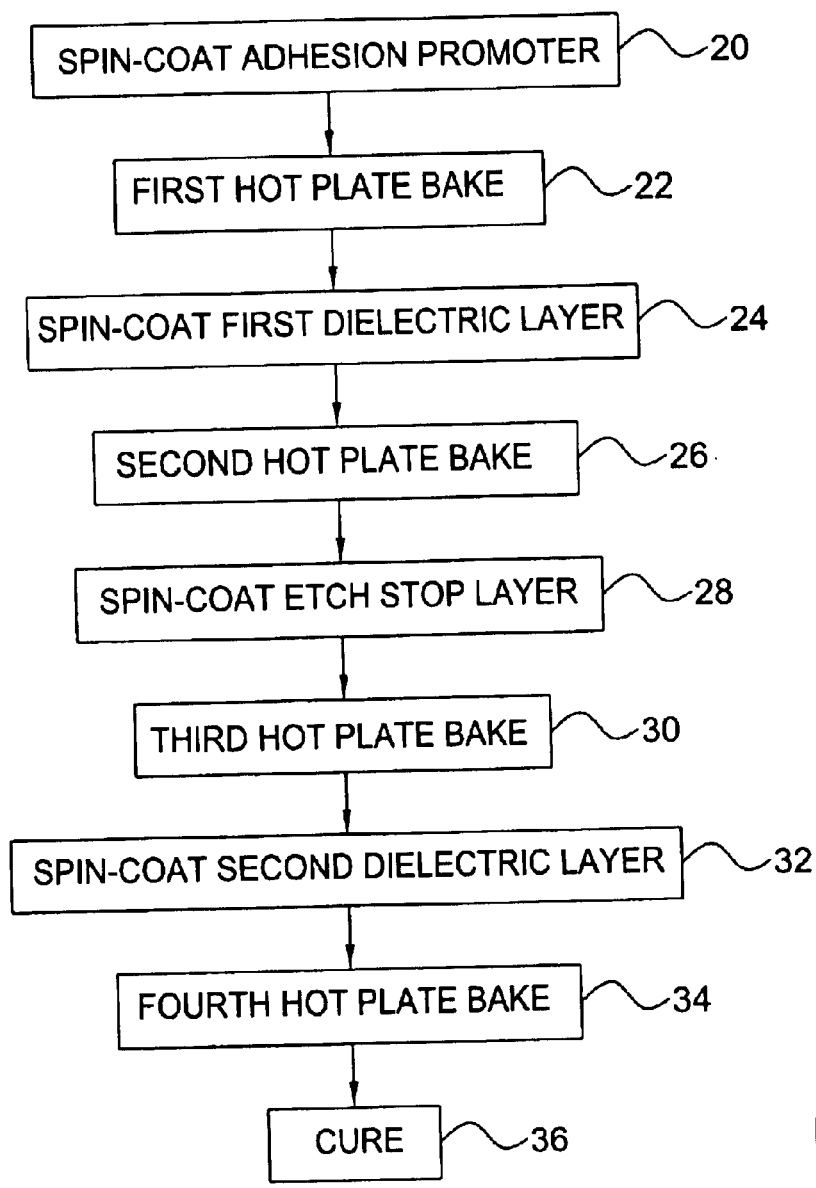

POROUS LOW-K DIELECTRIC INTERCONNECTS WITH IMPROVED ADHESION PRODUCED BY PARTIAL BURNOUT OF SURFACE POROGENS

CROSS REFERENCE TO RELATED APPLICATION

This application claims priority, under 35 U.S.C. 119(e), from provisional patent application Ser. No. 60/339,734 filed on Dec. 13, 2001.

This application is related to application Ser. No. 10/290,682, entitled Improved Toughness, Adhesion and Smooth Metal Lines of Porous Low-k Dielectric Interconnect Structures, assigned to the same assignee as the present application, and filed of even date herewith.

BACKGROUND OF THE INVENTION

1. Field of the Invention

This invention relates to interconnect structures for high-speed microprocessors, application specific integrated circuits (ASICs), and other high speed IC's. The invention provides ultra low dielectric constant (low-k) interconnect structures having enhanced circuit speed, precise values of conductor resistance, and improved mechanical integrity. The present invention also provides many additional advantages which shall become apparent as described below.

2. Background Art

This application is related to application Ser. No. 09/795,431, entitled Low-k Dielectric Interconnect Structure Comprised of a Multi Layer of Spin-On Porous Dielectrics, assigned to the same assignee as the present application, and filed on Feb. 28, 2001, the contents of which are incorporated herein by reference.

"Many low-k dielectric plus Cu interconnect structures of the dual damascene type are known. For an example of the dual damascene process wherein SiLK™ dielectric material may be used as a low-k dielectric material, reference is made to U.S. Pat. No. 6,383,920, which is assigned to the same assignee as the present invention, and is incorporated in its entirety by reference, as if fully set forth herein. In order to achieve the necessary reduction in the RC delay in future generations of integrated circuits, porous materials must be used as the dielectric. In addition, due to the 5–20 nanometer pore sizes of porous organic materials, a buried etch stop layer is necessary to give smooth metal line bottoms. These structures must go through several processing steps, including chemical mechanical polishing of the copper (CMP), which create stresses within the dielectric stack that can lead to delamination. The delamination can occur due to poor adhesion at the etch stop to dielectric interfaces."

SUMMARY OF THE INVENTION

It is an object of this invention to provide an ultra low-k dielectric plus Cu interconnect structure of the dual damascene type with precise and uniform control over the Cu conductor resistance with increased adhesion to prevent delaminations during CMP.

It is an object of this invention to provide a porous dielectric stack with a buried RIE stop with improved adhesion that is based on a multilayer of spin coated dielectrics.

It is another object of this invention to provide a method to make the inventive structure.

In accordance with the invention, an electrical interconnect structure on a substrate, comprises a first porous dielectric layer with surface region from which porogen has been removed; and an etch stop layer disposed upon the first porous dielectric layer so that the etch stop layer extends to partially fill pores in the surface region of the first porous dielectric layer from which the porogen has been removed. The structure may further comprise a second porous dielectric layer disposed upon the first porous dielectric layer. At least one of the first porous dielectric layer and the second porous dielectric layer may be comprised of of porous SiLK™, GX-3p™, or other porous low k dielectric materials where the porosity is formed from the decomposition of a sacrificial porogen, which may be a component of the material, as provided by the manufacturer. Materials of this kind are described in Patent Cooperation Treaty International Patent Application WO 00/31183 entitled A composition containing a cross-linkable matrix precursor and a porogen, and a porous matrix prepared therefrom of Kenneth, J. Bruza et al. which is assigned to The Dow Chemical Company, the contents of which are incorporated herein in their entirety by reference. The etch stop layer may be comprised of HOSP™, HOSP BESt™, Ensemble™ Etch Stop, Ensemble™ Hard Mask, organo silsesquioxanes, hydrido silsesquioxanes, hydrido-organo silsesquioxanes, siloxanes, or other spin-on material with etch selectivity to the porous dielectric. Materials of this kind are described in U.S. Pat. No. 6,218,020 entitled Dielectric films from organohydridosiloxane resins with high organic content of Nigel P. Hacker et al. which is assigned to AlliedSignal Inc., and U.S. Pat. No. 6,177,199 entitled Dielectric films from organohydridosiloxane resins with low organic content of Nigel P. Hacker et al. which is assigned to AlliedSignal Inc., the contents of which are incorporated herein in their entirety by reference.

"In accordance with the invention, an electrical interconnect structure on a substrate, comprises a first porous dielectric layer with surface region from which porogen has been removed; and an etch stop layer disposed upon the first porous dielectric layer so that the etch stop layer extends to partially fill pores in the surface region of the first porous dielectric layer from which the porogen has been removed. The structure may further comprise a second porous dielectric layer disposed upon the first porous dielectric layer. At least one of the first porous dielectric layer and the second porous dielectric layer may be comprised of porous SiLK™ dielectric material, GX-3p™ dielectric material, or other porous low k dielectric materials where the porosity is formed from the decomposition of a sacrificial porogen, which may be a component of the material, as provided by the manufacturer. Materials of this kind are described in Patent Cooperation Treaty International Patent Application WO 00/31183 entitled A composition containing a cross-linkable matrix precursor and a porogen, and a porous matrix prepared therefrom of Kenneth, J. Bruza et al. which is assigned to The Dow Chemical Company, the contents of which are incorporated herein in their entirety by reference. The etch stop layer may be comprised of HOSP™ Dielectric Etch Stop, HOSP BESt™ Dielectric Etch Stop, ENSEMBLE™ Dielectric Etch Stop, ENSEMBLE™ Dielectric Hard Mask, organo silsesquioxanes, hydrido silsesquioxanes, hydrido-organo silsesquioxanes, siloxanes, or other spin-on material with etch selectivity to the porous dielectric. Materials of this kind are described in U.S. Pat. No. 6,218020, entitled Dielectric films from organohydridosiloxane resins with high organic content of Nigel P. Hacker et al. which is assigned to AlliedSignal Inc., and U.S. Pat. No. 6,177,199 entitled Dielectric films from organohydridosiloxane resins with low organic content of Nigel P.

Hacker et al. which is assigned to AlliedSignal Inc., the contents of which are incorporated herein in their entirety by reference."

The invention is also directed to a method of forming an electrical interconnect structure on a substrate, comprising providing a first porous dielectric layer with surface region from which porogen has been removed; and forming an etch stop layer upon the first porous dielectric layer so that the etch stop layer extends to partially fill pores in the surface region of the first porous dielectric layer from which the porogen has been removed. The method may further comprise removing the porogen from the first surface region. The porogen may be removed by heating, and in particular by baking on a hot surface. The method may further comprise forming a second porous dielectric layer upon the first porous dielectric layer. At least one of the first porous dielectric layer and the second porous dielectric layer may be comprised of porous SiLK™, GX-3p™, or other porous low k dielectric materials where the porosity is formed from the decomposition of a sacrificial porogen. The method may further comprise forming a metal via in the first porous dielectric layer, and forming a metal line in the second porous dielectric layer.

The method may further comprise forming a plurality of patterned metal conductors within a multi layer stack of porous dielectric layers on the substrate, the stack including at least the first porous dielectric layer and the second porous dielectric layer. Additional dielectric layers may be added; and the structure may be completed by adding conductors. A top hard mask or polish stop layer may be applied to surface regions of the second dielectric from which porogen has been removed.

The method may further comprise curing the dielectric layers to render the dielectric layer porous. The dielectric layers in the stack are preferably cured in a single step after sequential application in a single tool. The dielectric application tool may be a spin coating tool containing high temperature hot plate baking chambers, and the curing step may be a furnace curing step conducted at a temperature of from about 300° C. to about 500° C. for about 15 minutes to about 3 hours.

Thus, the present invention is also directed to a metal wiring plus porous low dielectric constant (low-k) interconnect structure of the dual damascene type with a spin-on buried RIE stop, having improved adhesion. This aspect of the inventive structure is comprised of: A) a multilayer structure of all spin-on dielectric materials which are applied sequentially in a single tool, and then cured in a single furnace cure step, and B) a plurality of patterned metal conductors within the dielectric multilayer structure. The improved adhesion is obtained by partially burning out the porogen near the surface of the via level Porous SiLK prior to applying the etch stop.

The structure of the invention has improved adhesion over conventional spin-on buried etch stop structures as a result of the increased surface area of contact between the porous SiLK and etch stop, due to partial burnout of porogen at the surface. The structure of this invention is unique in that it has a layer of Porous SiLK, prior to porogen burnout, with a partial burnout of sacrificial porogens near the surface. This results in the top layer of pores being partially filled with the spin-on buried etch stop, leading to increased adhesion between the dielectric and the etch stop.

Other and further objects, advantages and features of the present invention will be understood by reference to the following specification in conjunction with the annexed drawings, wherein like parts have been given like numbers.

BRIEF DESCRIPTION OF THE DRAWINGS

FIG. 1A and FIG. 1B are schematic drawings of a prior art porous dielectric with a buried etch stop before RIE and metallization.

FIGS. 2A through 2D are schematic drawings of the inventive structures with partial burnout of porogen near the surface of the via level before RIE and metallization.

FIG. 3 is a schematic drawing of the inventive structures after RIE and metallization.

FIG. 4 is a process flow chart of a method for make the structure of FIG. 2.

DESCRIPTION OF THE PREFERRED EMBODIMENTS

A Structure in Accordance With the Invention

Referring to FIG. 1A and FIG. 1B, a silicon substrate 1 has thereon a first porous low k dielectric layer 5, an etch stop layer 7, and a second porous low k dielectric layer 9. Furnace curing may produce a weak interface between porous low k dielectric layer 5, an etch stop layer 7. This is because during this type of processing of porous SiLK™ (a Dow Company proprietary organic ultra low-k interlayer dielectric resin) with a spin-on buried etch stop layer, the porogen is not burnt out of the porous SiLK™ until both the line and via levels of porous SiLK™ along with the buried etch stop have been applied. Full burnout of the porogen in the via level of porous SiLK™ would require a 40 minute hold at 430° C. for all the porogen to diffuse out of the porous SiLK™ film, greatly increasing the raw process time. Therefore, the bottom layer of porous SiLK™ is hot plate baked for 1–3 minutes to partially react the porous SiLK™ film without removing the porogen. This bake cycle can lead to a weak interface between the via level porous SiLK™ and the etch stop if there is a high near surface concentration of porogen that is removed during the final cure.

Referring to FIG. 2A through FIG. 2D, and as described in more detail below, in accordance with the invention, improved adhesion is obtained by partially burning out the porogen near the surface of the via level Porous SiLK™ prior to applying the etch stop (FIG. 2B). By increasing the time or temperature of the intermediate hot plate bake, the porogen near the surface can be partially removed. This results in a higher surface area of contact between the via level Porous SiLK™ and etch stop resulting in improved adhesion.

Referring to FIG. 3, substrate 1 may contain electronic devices such as, for example, transistors and an array of conductor elements. An interconnect structure 3, in accordance with the invention is formed on substrate 1. Structure 3 is comprised of a first porous SiLK™ dielectric layer 5, having a thickness of 600–5000 Angstroms which may have a highly aromatic structure, that is thermally stable to approximately 425° C., with a glass transition temperature above 450° C., and a low dielectric constant of 2.2. The thickness may be selected within this broad range in accordance with the technology being implemented.

A HOSP™ (a spin-on hybrid organic-inorganic low k dielectric) etch stop layer 7 of thickness 200–600 Angstroms (more preferably 200–300 Angstroms), and having the atomic composition that gives etch selectivity of at least 10:1 to the porous dielectric, is disposed on the first porous SiLK™ layer 5. This material has good adhesion to the non-porous SiLK™ and thermal stability to a temperature of greater than 425° C., and a low dielectric constant of 3.2 or less.

A second porous SiLK™ dielectric layer 9, having a of thickness of 600–5000 Angstroms, and being a highly aromatic structure which is thermally stable to approximately 425° C., with a glass transition temperature above 450° C., and a low dielectric constant of 2.2, is disposed on the etch stop layer 7.

A top hard mask or polish stop layer 11 may be applied on surface regions of the second porous dielectric layer 9, from which porogen has been removed in the manner set forth herein.

Patterned metal lines 13 and vias 14, formed by a dual damascene process, are formed within the dielectric multilayer structure described above.

Other low-k spin coated materials may be used for the dielectric layers 5 and 9 and for the etch stop layer 7. Examples of other materials that could be used for layers 5 and 9 are GX-3p™, or other porous low k dielectric materials where the porosity is formed as a result of the decomposition of a sacrificial porogen. Examples of other materials that could be used for layer 7 are HOSP BESt™, Ensemble™ Etch Stop, Ensemble™ Hard Mask, organo silsesquioxanes, hydrido silsesquioxanes, hydrido-organo silsesquioxanes, siloxanes, or other spin-on material with etch selectivity to the porous dielectric.

A Method in Accordance With the Invention

A. The stack of Dielectric Layers is Formed

The interconnect structure 3 in accordance with the invention may be applied to the substrate 1 or wafer by spin on techniques. The first layer 5 in the structure 3 is preferably a porous low k dielectric with a desired thickness of 600–5000 Angstroms. This low k dielectric is applied by a spin-on technique with a spin speed of 1000–4000 rpm. After spinning, the substrate 1 is hot plate baked to remove the solvent of the low k dielectric at 100–350° C., for 30–120 seconds. The substrate 1 is then placed on an oxygen-controlled hot plate and cured at 400° C. for 5–10 minutes, or 400° C. for 2 minutes, followed by 430° C. for 2 minutes. These times and temperatures are sufficient to render the film of the first layer 5 insoluble, and to remove porogen at the surface of the film.

After cooling, a buried etch stop layer 7, with a desired thickness of 200–300 Angstroms, is applied by a spin-on technique with a spin speed of 1000–4000 rpm. The wafer is then placed on a hot plate and baked at 100–300° C. for 30–120 seconds to remove the solvent. It is then placed on a 300–400° C. oxygen controlled hot plate for 1–2 minutes. This time promotes sufficient crosslinking to render the film insoluble. After cooling, the top dielectric layer 9 is applied in a similar fashion. Layer 9 is the same composition as layer 5 with a slightly greater thickness. The desired thickness of the top low k dielectric layer 9 is 600–5000 Angstroms. This layer is spun at 1000–4000 rpm, and the wafer is then hot plate baked at 100–350° C., for 30–120 seconds, to remove the solvent.

B. The Stack of Dielectric Layers is Cured in a Single Cure Step

At this point the wafer is placed in a furnace in an atmosphere of pure $N_2$ (with very low $O_2$ and $H_2O$ concentrations), and cured at 350–450° C. for 15 minutes to 3 hours to crosslink the stack and burn out the sacrificial porogen. The sacrifical porogen thermally degrades and then diffuses out of the dielectric stack through the free volume of the dielectric layers and etch stop layer, leaving the porous dielectric layers in the stack.

C. Additional Dielectric Layers are Added for Dual Damascene Patterning (Distributed Hard Mask)

As noted above, the dual damascene process described in, for example, U.S. Pat. No. 6,383,920 may be used when adding additional layers.

D. The Dual Damascene Structure of FIG. 3 is Completed (Using Standard Process Steps)

This is standard dual damascene BEOL (back end of line) processing which includes forming a via in the bottom dielectric, and a trench in the top dielectric of the multilayer of spun-on dielectrics; filling the trench with at least a conductive metal; planarizing the conductive metal stopping on the hard mask or polish stop layer.

EXAMPLE

A Porous SiLK™/HOSP™/Porous SiLK™ Structure is Produced

A. The Stack of Dielectric Layers is Formed as in FIG. 1.

TABLE I

Process Flow Chart

| Process | Conditions |
| --- | --- |
| Spin-coat | Adhesion Promoter |
| Hot Plate Bake | 185° C./90 seconds |
| Spin-coat | 1st ILD layer (Porous SiLK) |
| Hot Plate Bake | 150° C./2 min. |
|  | 400° C./5 min. |
|  | or |
|  | 150° C./2 min. |
|  | 400° C./2 min. |
|  | 430° C./2 min. |
| Spin-coat | Buried Etch Stop (HOSP) |
| Hot Plate Bake | 150° C./2 min |
|  | 400° C./2 min |
| Spin-coat | 2nd ILD layer (Porous SiLK) |
| Hot Plate Bake | 150° C./2 min |
| Cure | Furnace-430° C./80 min. |

Referring to Table I above, and FIG. 4, at 20 a 200 mm diameter silicon wafer substrate is treated with adhesion promoter by applying a solution of AP 4000 to the wafer followed by spinning at 3000 rpm for 30 seconds. At 22, the wafer is then placed on a hot plate at 185° C. for 90 seconds for a first hot plate bake.

After cooling, the wafer returned to room temperature, at 24, the first layer of low k dielectric (porous SiLK™) is applied (layer 5, FIG. 1). The SiLK™ solution is placed on the wafer and the wafer is spun at 3000 rpm for 30 seconds. After spinning, the wafer is placed on a 150° C. hot plate for 2 minute to partially dry the solvent, at 26 (second hot plate bake). It is then transferred to a 400° C. hot plate for 5 minutes. As an alternative, at 26, the wafer is placed on a 150° C. hot plate for 2 minute to partially dry the solvent, transferred to a 400° C. hot plate for 2 minutes, and then transferred to a 430° C. hot plate for 2 minutes. The time and temperature schedule should be sufficient to render the film insoluble and burnout sacrificial porogen near the surface.

The wafer is then allowed to cool and was returned to the spinner. At 28, a solution of HOSP™, diluted to achieve a film thickness of 250 Å at a spin speed of 3000 rpm, is applied to the wafer and spun at 3000 rpm for 30 seconds, to produce etch stop layer 7 (FIG. 1). After spinning, at 30 (third hot plate bake), the wafer is placed on a hot plate at 150° C. for 2 minute to partially dry the solvent. It is then moved to a 400° C. hot plate for 2 minutes to partially crosslink the film. This time and temperature is sufficient to render the film insoluble.

At 32, a second layer of Porous SILK is applied in a manner similar to the first layer to produce layer 9 (FIG. 1). Porous SiLK is applied to the wafer and the wafer is spun at 3000 rpm for 30 seconds. At 34 (fourth hot plate bake), the wafer is placed on a 150° C. hot plate for 2 minute to partially dry the solvent.

At 36, the wafer is placed in an oxygen controlled oven and cured at 430° C. for 80 minutes to cure the SiLK and etch stop layers, promote crosslinking between the layers, and thermally degrade and burn out the porogen.

C. Additional Dielectric Layers are Added for Dual Damascene Patterning (Distributed Hard Mask)

The cured wafer containing the layers described above was placed in a PE CVD reactor and a 350 Angstrom layer of Silicon Nitride was deposited at 350° C., and then a 1500 Angstrom layer of $SiO_2$ was deposited at 350° C. This completes the formation of the dielectric multilayer of the Example.

D. The Dual Damascene Structure of FIG. 3 is Completed

Lithography and etching processes are then performed as described in, for example, U.S. Pat. No. 6,383,920. The dual damascene structure is then completed using standard process methods known in the industry (the etched trench and via opening are filled with a liner and then with Cu, and the Cu is planarized by CMP).

During the final CMP process, the silicon dioxide layer deposited in step C is removed, leaving the structure shown in FIG. 3. Advantageously, all of the dielectric layers (5, 7, and 9) shown in FIG. 3 have been cured in a single furnace cure step after sequential application of the three layers in a single spin/apply tool.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. An electrical interconnect structure on a substrate, comprising:
   a first porous dielectric layer with surface region from which porogen has been removed; and
   an etch stop layer disposed upon said first porous dielectric layer so that said etch stop layer extends to partially fill pores in the surface regions of said first porous dielectric layer from which said porogen has been removed;
   wherein said substrate is a semiconductor wafer having an adhesion promoter layer formed thereon.

2. The electrical interconnect structure of claim 1, further comprising a second porous dielectric layer disposed upon said etch stop layer.

3. The electrical interconnect structure of claim 2, wherein at least one of the first porous dielectric layer and the second porous dielectric layer is comprised of an organic dielectric material.

4. The electrical interconnect structure of claim 2, wherein at least one of the first porous dielectric layer and the second porous dielectric layer is comprised of a material wherein the porosity is formed as a result of decomposition of a sacrificial porogen.

5. The electrical interconnect structure of claim 2, wherein the first porous dielectric layer has a thickness in the range of substantially 600–5000 Angstroms.

6. The electrical interconnect structure of claim 2, wherein the second porous dielectric layer has a thickness in the range of substantially 600–5000 Angstroms.

7. The electrical interconnect structure of claim 2, wherein said etch stop layer is comprised of a spin-on material with etch selectivity to the porous dielectric layers.

8. The electrical interconnect structure of claim 2, wherein said etch stop layer is comprised of a material selected from the group consisting of organo silsesquioxanes, hydrido silsesquioxanes, hydrido-organo silsesquioxanes, and siloxanes.

9. The electrical interconnect structure of claim 2, wherein the etch stop layer has a thickness of substantially 200–600 Angstroms.

10. The electrical interconnect structure of claim 2, further comprising
    a plurality of patterned metal conductors formed within a multi layer stack of porous dielectric layers on the substrate, said stack including at least the first porous dielectric layer, the etch stop layer, and the second porous dielectric layer.

11. The electrical interconnect structure of claim 9, wherein at least one of the patterned metal conductors is an electrical via.

12. The electrical interconnect structure of claim 11, wherein at least one of the patterned metal conductors is a line connected to said via.

13. The electrical interconnect structure of claim 2, wherein the first porous dielectric layer has a metal via formed therein.

14. The electrical interconnect structure of claim 2, wherein the second porous dielectric layer has a metal line formed therein.

15. The electrical interconnect structure of claim 2, further comprising a hardmask layer disposed upon said second porous dielectric layer so that said hardmask layer extends to partially fill pores in a surface region of said second porous dielectric layer from which said porogen has been removed.

16. The electrical interconnect structure of claim 15, wherein said hard mask layer is comprised of a material with etch selectivity to the porous dielectric.

17. The electrical interconnect structure of claim 15, wherein said hard mask layer is comprised of a material selected from the group consisting of organo silsesquioxanes, hydrido silsesquioxanes, hydrido-organo silsesquioxanes, and siloxanes.

18. The electrical interconnect structure of claim 15, wherein said first and second porous dielectrics layers are comprised of organic dielectrics, and said etch stop layer is one of an inorganic low-k dielectric material and an inorganic/organic hybrid material.

19. The electrical interconnect structure of claim 2, wherein said inorganic low-k dielectric etch stop layer is porous.

20. The electrical interconnect structure of claim 1, wherein the first porous dielectric layer is comprised of an organic dielectric material.

21. The electrical interconnect structure of claim 1, wherein the first porous dielectric layer is comprised of a material wherein the porosity is formed as a result of decomposition of a sacrificial porogen.

22. The electrical interconnect structure of claim 1, wherein the first porous dielectric layer has a thickness in the range of substantially 600–5000 Angstroms.

23. The electrical interconnect structure of claim 1, wherein said etch stop layer is comprised of a spin-on material with etch selectivity to the porous dielectric of the dielectric layer.

24. The electrical interconnect structure of claim 1, wherein said etch stop layer is comprised of a material selected from the group consisting of organo silsesquioxanes, hydrido silsesquioxanes, hydrido-organo silsesquioxanes, and siloxanes.

25. The electrical interconnect structure of claim 1, wherein the etch stop layer has a thickness of substantially 200–600 Angstroms.

* * * * *